(12) United States Patent
Hagan et al.

(10) Patent No.: US 12,123,896 B2
(45) Date of Patent: Oct. 22, 2024

(54) END LAUNCH TERMINATION DEVICES

(71) Applicant: Krytar, Inc., Sunnyvale, CA (US)

(72) Inventors: Douglas John Hagan, Palo Alto, CA (US); Michael Romero, Milpitas, CA (US)

(73) Assignee: Krytar, Inc., Sunnyvale, CA (US)

( * ) Notice: Subject to any disclaimer, the term of this patent is extended or adjusted under 35 U.S.C. 154(b) by 176 days.

(21) Appl. No.: 18/149,575

(22) Filed: Jan. 3, 2023

(65) Prior Publication Data

US 2023/0213553 A1 Jul. 6, 2023

Related U.S. Application Data

(60) Provisional application No. 63/296,304, filed on Jan. 4, 2022.

(51) Int. Cl.
*G01R 1/04* (2006.01)

(52) U.S. Cl.
CPC .................. *G01R 1/0416* (2013.01)

(58) Field of Classification Search
CPC ...... H01P 3/10; H01P 7/08; H01P 3/12; H01P 5/085; H01P 5/103; H01P 5/12; H01P 3/127; H01P 5/18; H01P 1/045; H01P 1/227; H01P 5/04; H01P 5/107; H01P 3/16; H01P 1/268; H01P 5/188; H05K 2201/09809; H05K 2201/1053; H03B 5/1841; H03B 5/1882; H04B 3/46; H04B 3/52; H04B 3/54; H04B 3/04; H04L 25/0264; H04L 25/0204; G01R 1/0491; G01R 1/07378; G01R 31/2889; G01R 29/0878; H01R 24/50; H01R 12/7047; H01R 12/725; H01R 12/7011

See application file for complete search history.

(56) References Cited

U.S. PATENT DOCUMENTS

| | | | | |
|---|---|---|---|---|
| 7,600,855 B2 * | 10/2009 | Yagi | ......................... | B41J 2/155 |
| | | | | 347/49 |
| 7,887,335 B2 * | 2/2011 | Morley | .................. | H01R 13/46 |
| | | | | 439/63 |
| 9,570,790 B2 * | 2/2017 | Nagel | ........................ | H01P 1/02 |
| 9,973,940 B1 * | 5/2018 | Rappaport | ............... | H04B 3/46 |
| 2009/0061653 A1 | 3/2009 | Mizushina et al. | | |

(Continued)

OTHER PUBLICATIONS

U.S. Receiving Office, International Search Report and Written Opinion for PCT Application No. PCT/US23/060113, dated Jun. 30, 2023, 10 pages.

(Continued)

*Primary Examiner* — Vinh P Nguyen
(74) *Attorney, Agent, or Firm* — Chernoff, Vilhauer, McClung & Stenzel, LLP

(57) ABSTRACT

End launch termination devices are shown and disclosed. In one embodiment, the device includes a housing, a first clamp fixedly attached to the housing, and a second clamp opposed to the first clamp and movably attached to at least one of the first clamp or the housing, the first and second clamps defining a gap therebetween to receive a test substrate. The device additionally includes a conductor received in the cavity and fixedly attached to the housing, a center pin attached to the conductor and extending into the gap, and a rod resistor received in the cavity, attached to the conductor, and extending out of the housing.

20 Claims, 6 Drawing Sheets

(56) References Cited

U.S. PATENT DOCUMENTS

2011/0021042 A1  1/2011  Weidner et al.
2015/0288085 A1  10/2015  Moncayo et al.
2018/0138615 A1  5/2018  Matsumoto

OTHER PUBLICATIONS

The Design & Test of Broadband Launches up to 50 Ghz on Thin & Thick Substrates. Datasheet [online]. Southwest Microwave, 2011 [retrieved on May 6, 2023]. Retrieved from the Internet: <URL: h tips:// mpd. southwestmicrowave. com/wp-content/u ploads/2018/0 7 /The-Design-and-Test-of-Bro adband-Launches-up-to-50-GHz-on-Thin-and-Thick-Substrates.pdf>, 28 pages.

* cited by examiner

END LAUNCH TERMINATION DEVICES

CROSS-REFERENCE TO RELATED APPLICATIONS

This application claims the benefit of U.S. Provisional Patent Application Ser. No. 63/296,304, which was filed on Jan. 4, 2022 and entitled "End Launch Termination Devices." The complete disclosure of the above application is hereby incorporated by reference for all purposes.

BACKGROUND OF THE INVENTION

The present disclosure is directed to radio frequency (RF) electronic components, and more specifically to end launch termination devices.

When semiconductor components are manufactured, there is a need to characterize and/or evaluate those components. Various methods are used to evaluate the semiconductor components. For example, multiple chipsets for 5G mobile phones may be mounted on a single test substrate or printed circuit board (PCB) with each of the chipsets may have one or more connectors, such as microstrips and/or striplines. However, the presence of other chipsets on the test substrate may lead to signal reflections that may interfere with testing of a particular chipset.

What is desired, therefore, is a device that can be attached to test substrates to minimize signal reflections and optimize testing of components mounted to those test substrates.

BRIEF DESCRIPTION OF THE SEVERAL DRAWINGS

For a better understanding of the disclosure, and to show how the same may be carried into effect, reference will now be made, by way of example to the accompanying drawings, which:

DETAILED DESCRIPTION OF PREFERRED EMBODIMENTS

Figure 1:
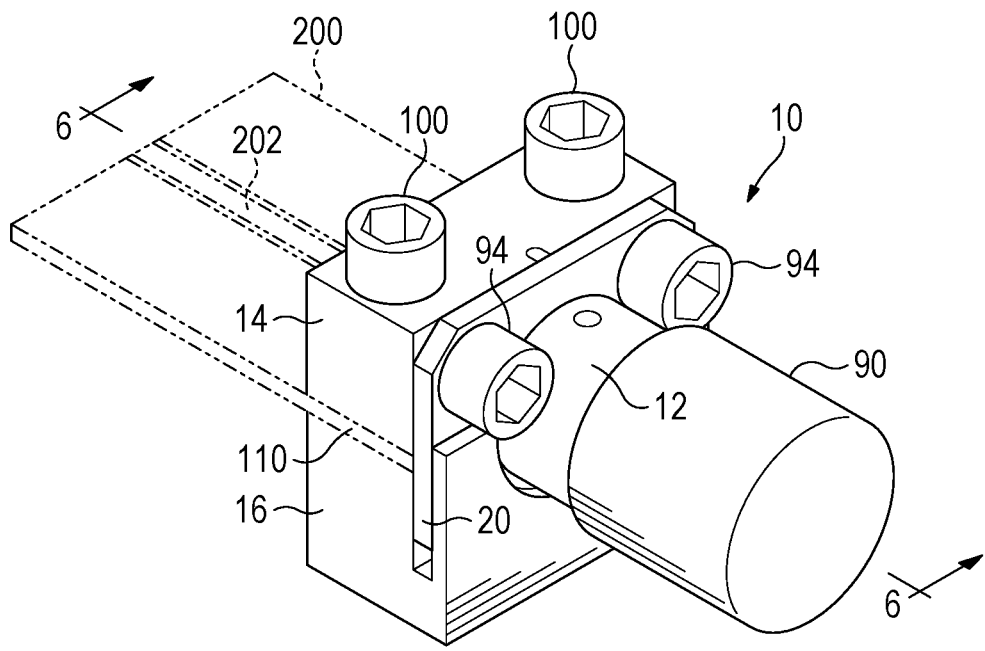
FIGS. 1-2 show isometric views of an example of an end launch termination device of the present disclosure.
Figure 2:
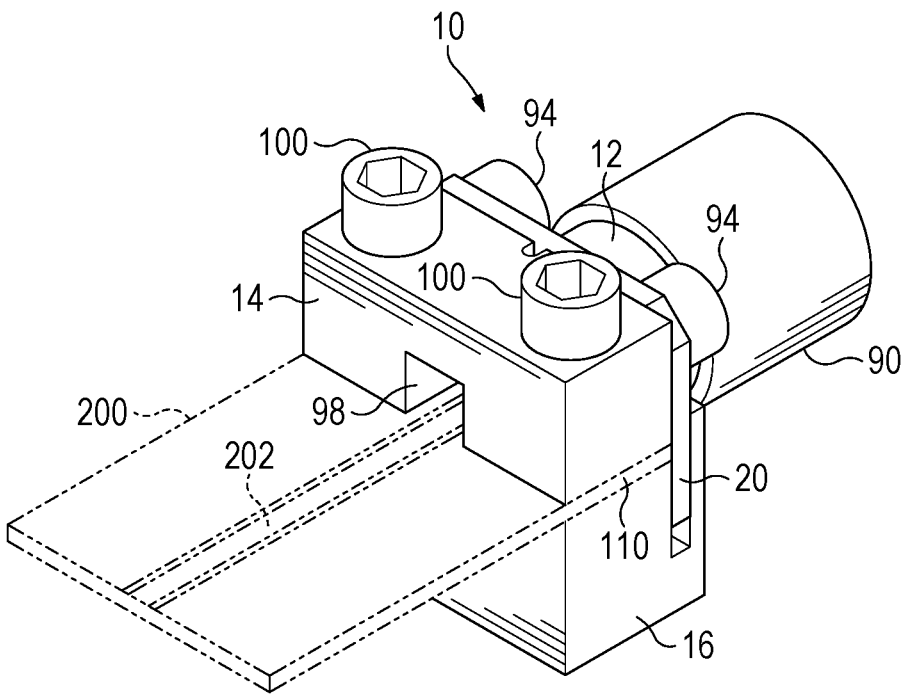
Figure 3:
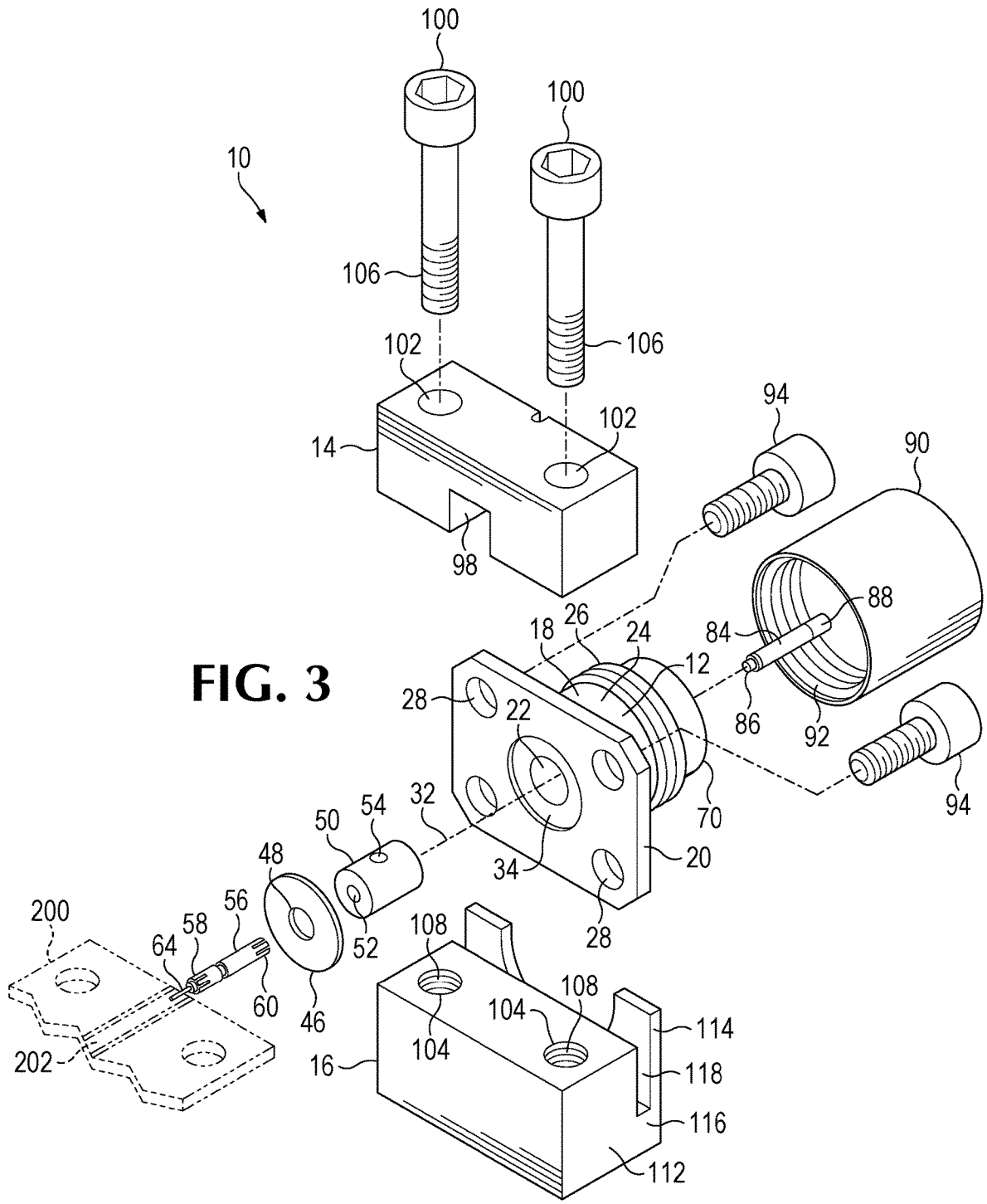
FIGS. 3-4 show exploded views of the end launch termination device of FIG. 1.
Figure 4:
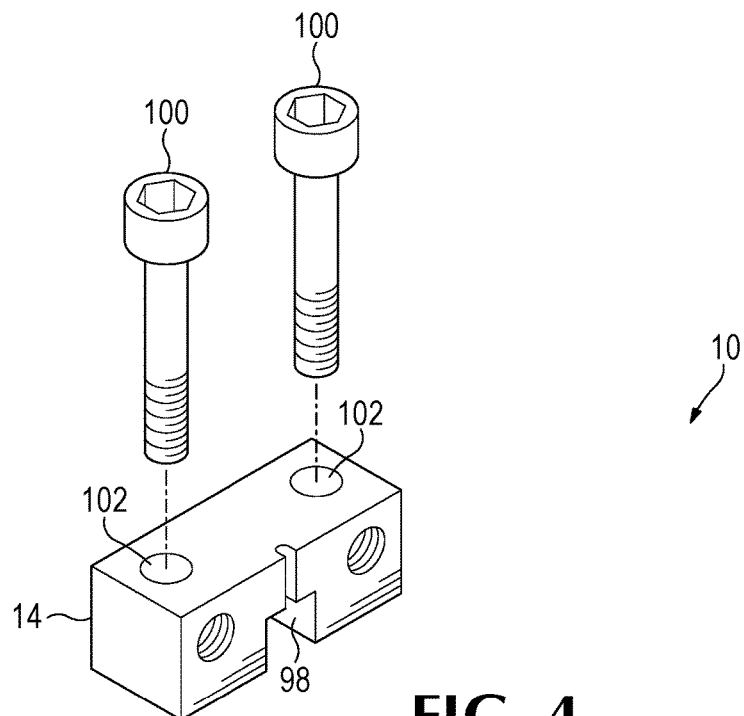
Figure 4:
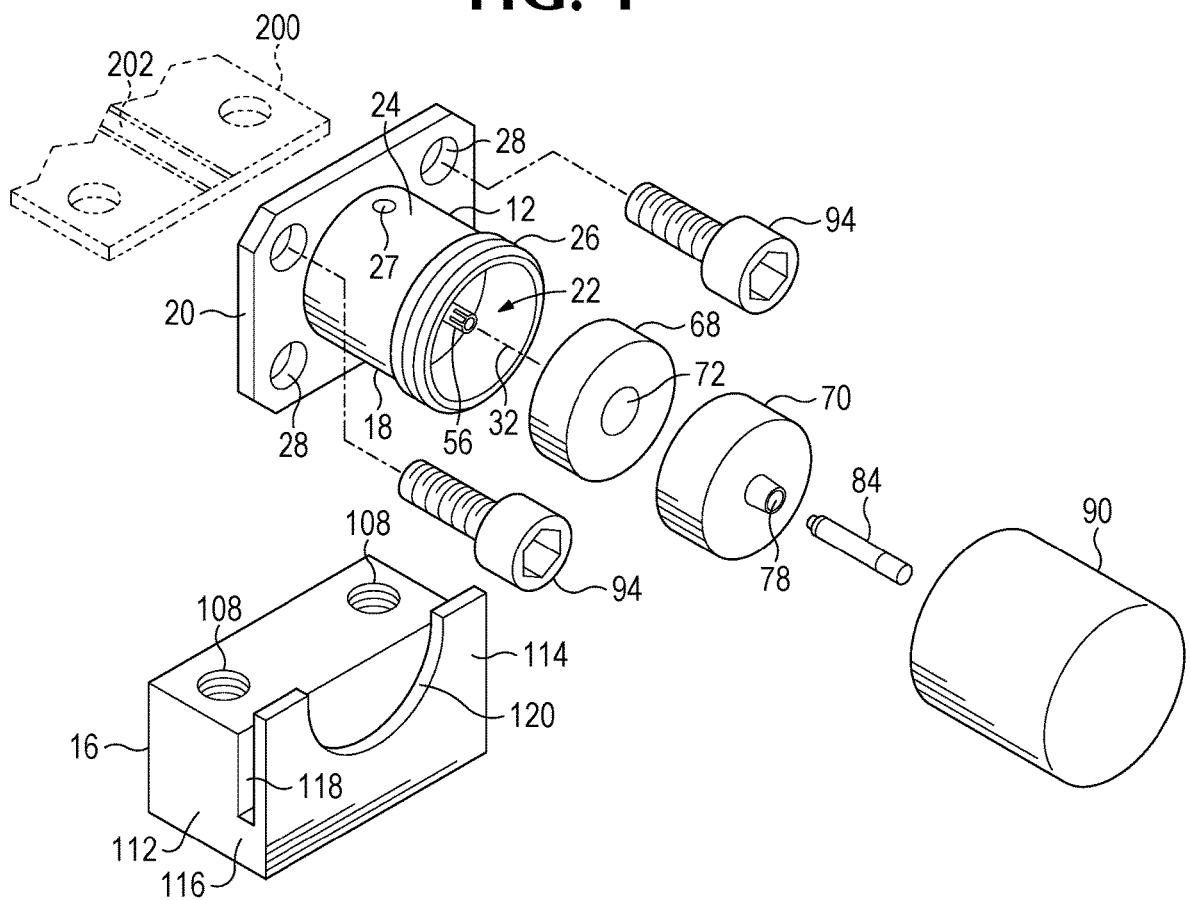

Referring to FIGS. 1-7, an illustrative example of an end launch termination device 10 of the present disclosure is shown. The end launch termination device includes a termination body or housing 12, a first clamp 14, and a second clamp 16.

Housing 12 includes a base portion 18, a flange portion 20, and a cavity 22. In the example shown in FIGS. 1-7, base portion 18 is cylindrical having an outer surface 24 with threads 26. The base portion includes a through hole 27 having a longitudinal axis that is transverse or perpendicular to the longitudinal axis of cavity 22. However, other examples of base portion 18 may have different shapes and/or may exclude the threads. Flange portion 20 is generally planar and includes fastener holes 28 sized to receive fasteners. The flange portion is attached to, or formed with, base portion 18. Flange portion 20 may sometimes be described as a protruded ridge, lip, or rim of base portion 18. Although flange portion 20 is shown in FIGS. 1-7 as having a generally cuboid shape, the flange portion may alternatively be disc or cylindrical shaped.

Cavity 22 runs along a longitudinal axis 32 defined by housing 12 to provide cavity openings 32 on opposed longitudinal ends of housing 12. Cavity 22 includes a periphery portion 34 having a first diameter 36, a proximal portion 38 having a second diameter 40 and a distal portion 42 having a third diameter 44. In the example shown in FIGS. 1-7, third diameter 44 is larger than first diameter 36, which is larger than second diameter 40. However, other examples of cavity 22 may include the first, second, and third diameters having different relationships, such as second diameter 40 being equal to or larger than third diameter 44.

Figure 5:
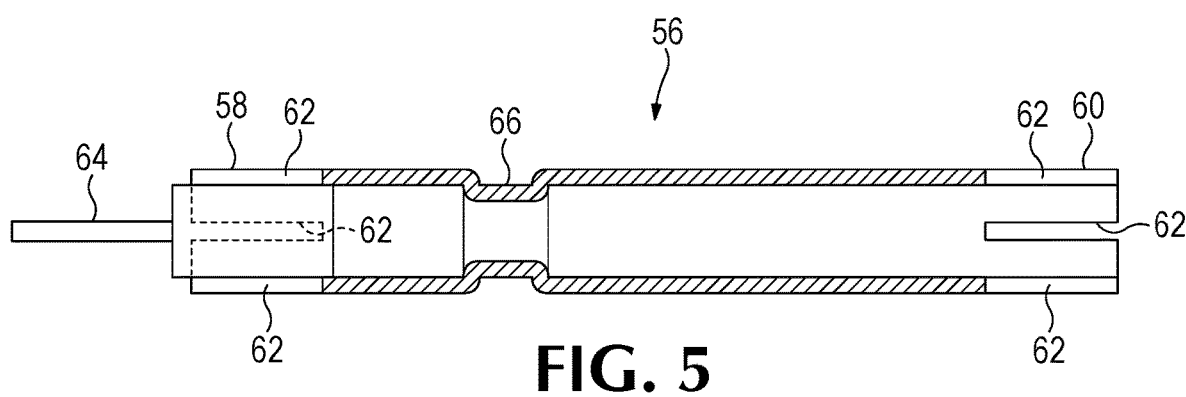
FIG. 5 shows a sectional view of an example of a conductor of the end launch termination device of FIG. 1.
Figure 6:
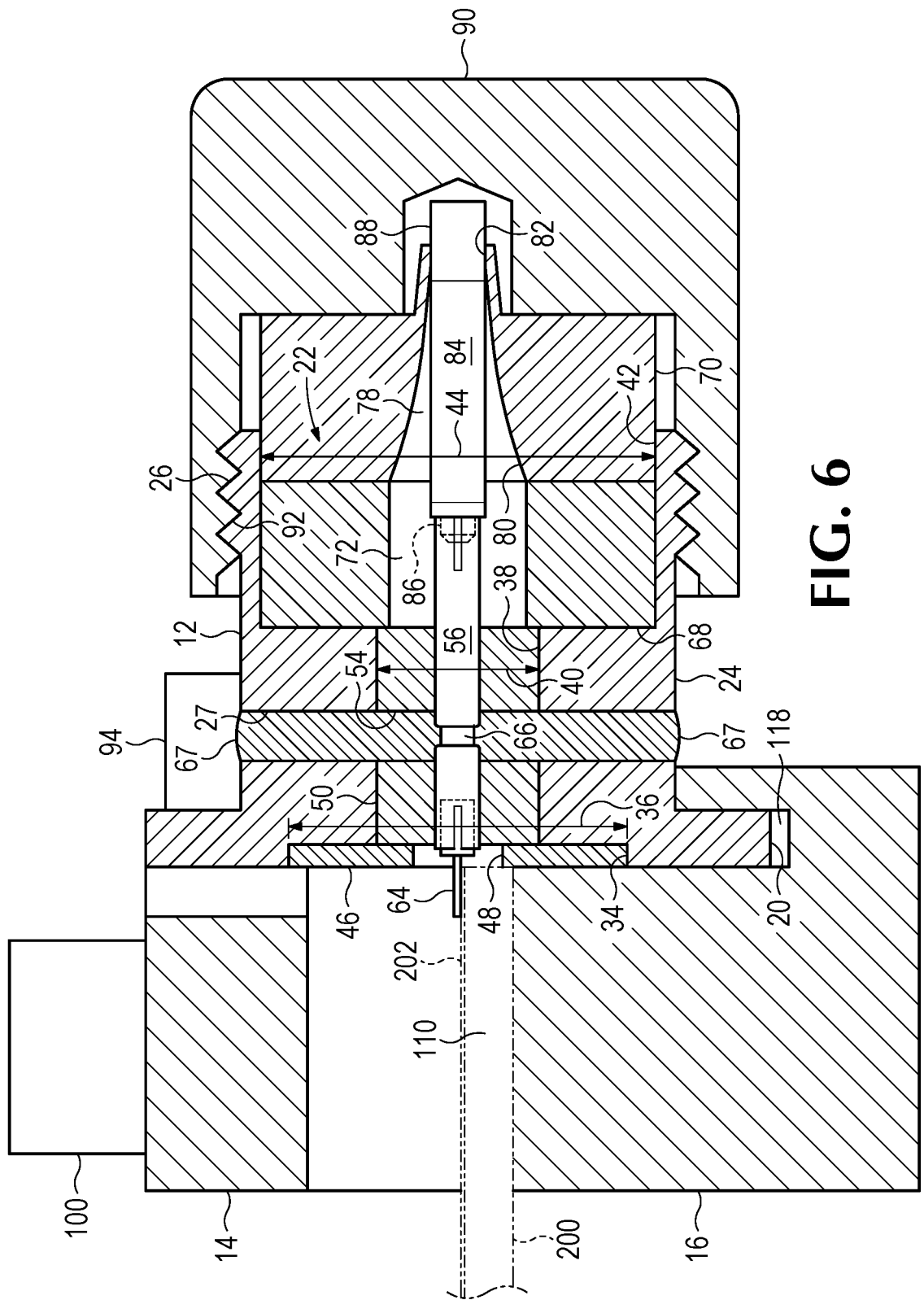
FIG. 6 shows a sectional view of the end launch termination device of FIG. 1 taken along lines 6-6 in FIG. 1, showing an example of a second clamp in an engaged position.
Figure 7:
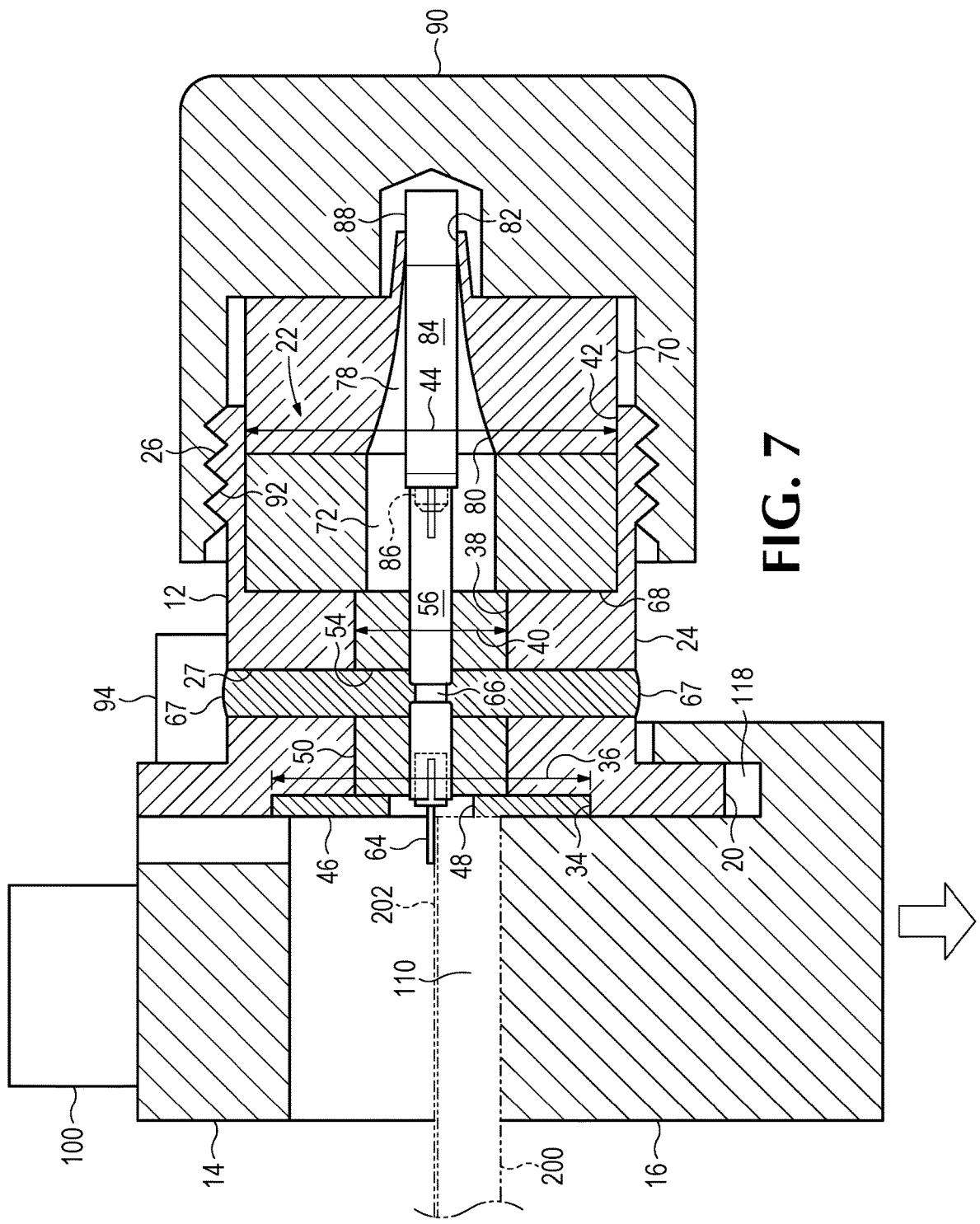
FIG. 7 shows the end launch termination device of FIG. 5, showing the second clamp in a disengaged position.

A washer 46 is received in periphery portion 34 and fills that periphery portion. In other words, the washer has a diameter or height that is about the same diameter or height as the periphery portion. The washer includes a hole 48 that allows a center pin of a central conductor to extend outside the hole and the periphery portion, as further discussed below. Additionally, a proximal spacer 50 is received in proximal portion 38 of cavity 22 and fills that proximal portion. In other words, proximal spacer 50 has a diameter or height that is about the same diameter or height as the proximal portion. The proximal spacer may be made of any suitable materials, such as one or more insulating materials. The proximal spacer includes a central spacer opening 52 and a spacer hole or spacer channel 54. The central spacer opening 52 receives and/or supports a central conductor or conductor 56 having opposed proximal and distal end portions 58, 60. As best shown in FIG. 5, each of end portions 58 and 60 includes a plurality of slots 62 that allows insertion of one or more structures. Proximal end portion 58 receives a center tab or center pin 64, while distal end portion 60 receives an end portion of a resistor, as further discussed below. The center tab is placed in contact with and/or launches into a microstrip or a stripline 202 of a test substrate 200, such as when the substrate is sandwiched or is between first clamp and second clamp. In the example shown in FIGS. 1-7, conductor 56 is cylindrical and includes a reduced diameter section 66 between the proximal and distal end portions corresponding to spacer hole 54. Central conductor 56 and base portion 18 may sometimes be described as collectively forming a co-axial line.

Spacer hole 54 corresponds with through hole 27 of base portion 18 (or is in fluid communication with that through hole). The spacer hole is filled with or receives adhesive 67 (e.g., epoxy) to secure the proximal spacer and the conductor to base portion 18. In the example shown in FIGS. 1-7, the spacer hole is transverse or perpendicular to central spacer opening 52 but the spacer hole can be any suitable angle relative to the central spacer opening that corresponds with the through hole of the base portion. The dried adhesive secures or fixedly attaches the conductor and proximal spacer to the base portion. The "thinned-out" or reduced diameter portion of the conductor allows the adhesive to "capture" or wrap around the conductor.

A distal spacer 68 and a shell 70 are received in distal portion 42 of base portion 18 and fills that distal portion. In other words, distal spacer 68 and shell 70 each has a diameter or height that is about the same diameter or height as the distal portion. In the example shown in FIGS. 1-7, distal spacer 68 is a metallic cylinder with a spacer central channel 72 but other examples have other suitable shape(s). Conductor 56 is received in the spacer central channel. The distal spacer functions as an outer conductor and serves to space the shell and the flat edge or end of the termination opposite the center pin. The distal spacer has an inner diameter and an outer diameter. The inner diameter (or the diameter of spacer central channel 72) provides the needed capacitance between the distal spacer and the conductor. The longitudinal length of the distal spacer ensures that the shell mechanically fits with the resistor, as further discussed below. In some examples, distal spacers of different sizes may be used to achieve the best return loss specification.

Shell 70 is received in distal portion 42 of base portion 18 and is adjacent to and in contact with distal spacer 68. In other words, distal spacer 68 is disposed between proximal spacer 50/base portion 18 and shell 70. Shell 70 includes a shell central channel 78. In the example shown in FIGS. 1-7, the shell is a metallic cone but other examples may have other suitable shape(s). Shell central channel 78 has an inner diameter that gradually narrows from a wide end portion 80 toward an opposed narrow end portion 82. The narrow end portion of the shell central channel is sized to contact and grip a conductive end of a resistor, as further discussed below. The shell functions as a transition part between the spacer and the resistor by providing a smooth termination of the coaxial line to a purely resistive load of the resistor. Although spacer and terminal shell are shown to be distinct components, other examples of the end launch termination devices may include a single distal spacer/terminal shell component.

A resistor 84, such as a 50 ohm rod resistor, is received in spacer central channel 72 and shell central channel 78. The resistor has opposed conductive ends 86 and 88. Conductive end 88 is contacted and secured by narrow end portion 82 of shell 70. Conductive end 86 fits into distal end portion 60 of central conductor 56. The resistor is adapted to create a "good match" between the RF side, central conductor, and its resistive component. In other words, if the circuit's impedance is 50 ohms, then the end of the transmission line is well-matched with a 50 ohms resistor to terminate the signal with no reflection/return loss. Conductive end 88 of resistor 84 extends out of shell 70.

In some examples, housing 12 further includes a termination cap or termination cover 90 that attaches to base portion 18 opposite to flange portion 20. In the example shown in FIGS. 1-7, termination cover 90 includes internal threads 92 that correspond with external threads 26 of base portion 18. The cover is a conductive part that serves as an end cap for the termination. The cover protects device 10 from the effects of environmental conditions.

A top block or first clamp 14 is attached or fixedly attached to housing 12. In the example shown in FIGS. 1-7, first clamp 14 is fixedly attached to housing 12 via fasteners 94 received in fastener holes 28 of flange portion 20. However, first clamp 14 may alternatively be formed with housing 12 or attached to the housing via welding or other suitable means. First clamp 14 is generally U-shaped having a channel 98, which allows a user to visually confirm that center pin 64 is in contact with microstrip or stripline 202 of test substrate 200.

A bottom block or second clamp 16 is opposed to first clamp 14. The second clamp is movably attached and/or connected to first clamp 14 via fasteners 100 received in holes 102 of first clamp 14 and holes 104 of second clamp 16. In the example shown in FIGS. 1-7, fasteners 100 include external threads 106 that correspond with internal threads 108 of holes 104 allowing a user to slide or move the second clamp toward or away from the first clamp. Alternatively, or additionally, second clamp 16 may be movably attached to housing 12. First clamp 14 and second clamp 16 define or form a gap 110 therebetween to receive a test substrate 200. Center pin 64 extends into the gap and contacts stripline 202 of test substrate 200 when the first and second clamps contact and secure the test substrate therebetween.

Second clamp 16 includes a body portion 112, a bracing portion 114, and a bridge portion 116 disposed between the body portion and the bracing portion. Body portion 112 includes holes 104 with internal threads 108. Bridge portion 116 has a height substantially less than body portion 112 to define or form a first cavity 118 between body portion 112 and bracing portion 114. First cavity 118 receives a portion of flange portion 20 such that second clamp 16 remains in physical and/or direct contact (or electrical contact) with the flange portion as the second clamp moves toward or away from the first clamp. Bracing portion 114 includes a second cavity 120 that receives part of flange portion 20. In the example shown in FIGS. 1-7, bracing portion 114 is U-shaped but can be other suitable shape(s). Although end launch termination devices 10 with particular components are shown in FIGS. 1-7, other examples of the end launch termination devices may include one or more additional components and/or exclude one or more components. For example, other examples of the end launch termination devices may exclude the shell and/or the resistor. In those embodiments, the spacer may also span the distal portion of cavity 22. Alternatively, the resistor may be rectangular shape (instead of rod- or cylindrical-shape).

The end launch termination devices of the present disclosure provide the functionality of two separate devices, namely an end launch connector and a coaxial termination, without the need to mate those two devices Eliminating the need to mate two separate coaxial devices yield better electrical specification, including maximizing the voltage standing wave ratio (VSWR) of the end launch termination devices. Additionally, the end launch termination devices of the present disclosure can be used in applications requiring broadband and high frequency, while eliminating the additional costs and complexity of coaxial terminations and the additional labor time to connect separate coaxial terminations.

Example Features

This section describes additional aspects and features of end launch termination devices, presented without limitation as a series of paragraphs, some or all of which may be alphanumerically designated for clarity and efficiency. Each of these paragraphs can be combined with one or more other paragraphs, and/or with disclosure from elsewhere in this application in any suitable manner. Some of the paragraphs below expressly refer to and further limit other paragraphs, providing, without limitation, examples of some of the suitable combinations.

A1. An end launch termination device comprising an end launch connector and a coaxial termination attached to, or formed with, the end launch connector.

B1. An end launch termination device comprising a top block, a bottom block movably connected to the top block, a termination body, and a termination cap.

B2. The device of paragraph B1, wherein the termination body includes a flange portion and a base portion.

B3. The device of paragraph B2, wherein the bottom block includes a cavity that receives the flange portion of the termination body such that the bottom block remains on contact with the flange portion as the bottom block is moved toward or away from the top block.

B4. The device of any of paragraphs B2-B3, the base portion includes a proximal central channel that extends longitudinally along the length of the base portion.

B5. The device of paragraph B4, wherein the proximal central channel includes a first portion having a first diameter and a second portion having a second diameter larger than the first diameter.

B6. The device of paragraph B5, further comprising a tab connected to a coaxial line is contained within the first portion of the proximal central channel, the tab extending outward from the central channel between the top and bottom blocks.

B7. The device of paragraph B6, wherein the coaxial line includes an internal conductor connected to the tab and an insulator enclosing the internal conductor.

B8. The device of any of paragraphs B5-B7, further comprising a spacer and a shell adjacent to and contacting the spacer contained within the second portion of the proximal central channel.

B9. The device of paragraph B8, wherein the spacer and the shell each includes a channel collectively defining a distal central channel.

B10. The device of paragraph B9, further comprising a resistor contained within the distal central channel.

B11. The device of paragraph B10, further comprising a center conductor connecting a first conductive end of the resistor with the internal conductor.

B12. The device of any of paragraphs B8-11, wherein the shell is conical having a wide end and and a narrow end.

B13. The device of paragraph B12, wherein the narrow end is sized to contact and secure a second conductive end of the resistor, the second conductive end being opposed from the first conductive end.

It will be appreciated that the invention is not restricted to the particular embodiment that has been described, and that variations may be made therein without departing from the scope of the invention as defined in the appending claims, as interpreted in accordance with principles of prevailing law, including the doctrine of equivalents or any other principle that enlarges the enforceable scope of a claim beyond its literal scope. Unless the context indicates otherwise, a reference in a claim to the number of instances of an element, be it a reference to one instance or more than one instance, requires at least the stated number of instances of the element but is not intended to exclude from the scope of the claim a structure or method having more instances of that element than stated. The word "comprise" or a derivative thereof, when used in a claim, is used in a nonexclusive sense that is not intended to exclude the presence of other elements or steps in a claimed structure or method.

We claim:

1. An end launch termination device, comprising:
   a housing having a cavity;
   a first clamp fixedly attached to the housing;
   a second clamp opposed to the first clamp and movably attached to at least one of the first clamp or the housing, the first and second clamps defining a gap therebetween to receive a test substrate;
   a conductor having opposed first and second end portions, the conductor being received in the cavity and fixedly attached to the housing;
   a center pin attached to the first end portion of the conductor, the center pin extending into the gap; and
   a rod resistor having opposed third and fourth end portions, the rod resistor being received in the cavity, the third end portion being attached to the second end portion of the conductor, and the fourth end portion extending out of the housing.

2. The device of claim 1, wherein the housing includes a base portion and a flange portion, the first clamp being fixedly attached to the flange portion.

3. The device of claim 2, wherein the second clamp includes a first cavity that receives part of the flange portion such that the second clamp remains in contact with the flange portion as the second clamp moves toward or away from the first clamp.

4. The device of claim 3, wherein the second clamp includes a second cavity that receives part of the base portion.

5. The device of claim 4, wherein the second clamp includes a U-shaped portion that defines the second cavity.

6. The device of claim 4, wherein the second clamp includes a body portion, a bracing portion, and a bridge portion disposed between the body portion and the bracing portion.

7. The device of claim 6, wherein the bridge portion has a height substantially less than the body portion to define the first cavity between body portion and the bracing portion.

8. The device of claim 6, wherein the bracing portion is U-shaped to define a second cavity that receives part of the base portion.

9. The device of claim 1, wherein the conductor includes a plurality of slots in the first and second end portions.

10. The device of claim 1, wherein the conductor is cylindrical and includes a reduced diameter section between the first and second end portions.

11. The device of claim 10, wherein the base portion includes a through hole perpendicular to a longitudinal axis of the conductor, further comprising cured adhesive in the through hole.

12. The device of claim 11, wherein the cured adhesive wraps around the reduced diameter section.

13. The device of claim 1, further comprising a shell received in the cavity, the rod resistor being received in an opening of the shell.

14. The device of claim 13, wherein the opening of the shell narrows to contact and grip the fourth end portion of the rod resistor.

15. The device of claim 1, wherein the housing includes a base portion and a flange portion, the base portion being cylindrical and having an outer surface with threads.

16. The device of claim 15, further comprising a cover having an internal surface with threads corresponding to the threads of the outer surface of the base portion.

17. The device of claim 1, wherein the cavity includes a first portion having a first diameter and a second portion adjacent to the first portion and having a second diameter larger than the first diameter.

18. The device of claim 17, further comprising a first spacer received in the first portion and having a first aperture that receives a first part of the conductor.

19. The device of claim 17, further comprising a second spacer received in the second portion and having a second aperture that receives a second part of the conductor and a first part of the rod resistor.

20. The device of claim 19, further comprising a shell received in the second portion, the second spacer being disposed between the first spacer and the shell, a second part of the rod resistor being received in an opening the shell, wherein the opening of the shell narrows to contact and grip the fourth end portion of the rod resistor.

* * * * *